United States Patent
Basu et al.

(10) Patent No.: US 11,237,841 B2
(45) Date of Patent: Feb. 1, 2022

(54) CONFIGURABLE MEDIA STRUCTURE

(71) Applicant: Micron Technology, Inc., Boise, ID (US)

(72) Inventors: Reshmi Basu, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 294 days.

(21) Appl. No.: 16/546,416

(22) Filed: Aug. 21, 2019

(65) Prior Publication Data

US 2021/0055935 A1 Feb. 25, 2021

(51) Int. Cl.
G06F 9/4401 (2018.01)
G06F 11/14 (2006.01)
G11C 11/56 (2006.01)
G06F 12/02 (2006.01)
G06F 11/10 (2006.01)
G11C 7/20 (2006.01)
G11C 16/20 (2006.01)

(52) U.S. Cl.
CPC .......... G06F 9/441 (2013.01); G06F 11/102 (2013.01); G06F 11/1417 (2013.01); G06F 12/0238 (2013.01); G11C 11/5628 (2013.01); G06F 2212/7201 (2013.01); G11C 7/20 (2013.01); G11C 16/20 (2013.01)

(58) Field of Classification Search
CPC .............. G06F 11/102; G06F 11/1417; G06F 12/0238; G06F 2212/7201; G06F 9/441; G11C 11/5628; G11C 16/20; G11C 7/20
See application file for complete search history.

(56) References Cited

U.S. PATENT DOCUMENTS

| | | | |
|---|---|---|---|
| 6,421,777 B1 | 7/2002 | Pierre-Louis et al. | |
| 7,996,711 B2 | 8/2011 | Edwards et al. | |
| 8,190,714 B2 | 5/2012 | Davidson et al. | |
| 9,389,787 B2* | 7/2016 | McCarthy | G06F 3/061 |
| 9,652,252 B1* | 5/2017 | Kochar | G06F 1/3234 |
| 9,983,889 B1 | 5/2018 | Sarmah | |
| 2012/0272050 A1 | 10/2012 | Seo et al. | |
| 2013/0031346 A1 | 1/2013 | Sakarda | |
| 2015/0039876 A1* | 2/2015 | Baratam | G06F 9/4401 713/2 |
| 2015/0149144 A1* | 5/2015 | Davis | G06F 3/0631 703/20 |

OTHER PUBLICATIONS

International Search Report and Written Opinion from related PCT Application No. PCT/US2020/044036, dated Nov. 6, 2020, 12 pages.

* cited by examiner

*Primary Examiner* — Terrell S Johnson
(74) *Attorney, Agent, or Firm* — Brooks, Cameron & Huebsch, PLLC

(57) ABSTRACT

Systems, apparatuses, and methods related to configurable media structure are described. A memory device can be configured to boot up in a variety of configurations. The variety of configurations can include using the memory device for persistent memory storage, for non-persistent memory storage, etc. For instance, an apparatus can include a first memory array and a second memory array. The apparatus can include a memory controller coupled to the first memory array and the second memory array. The second memory array can be configured to store at least two boot images. The first memory array can be configured to operate based on which of the at least two boot images is used.

23 Claims, 5 Drawing Sheets

CONFIGURABLE MEDIA STRUCTURE

TECHNICAL FIELD

The present disclosure relates generally to semiconductor memory and methods, and more particularly, to apparatuses, systems, and methods involving a configurable media structure.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and variable resistance memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host and/or applications running on the host while the computer or electronic system is operating. For example, data, commands, and/or instructions can be transferred between the host and the memory device(s) during operation of an application running on a host, computing, or other electronic system.

DETAILED DESCRIPTION

Figure 1:
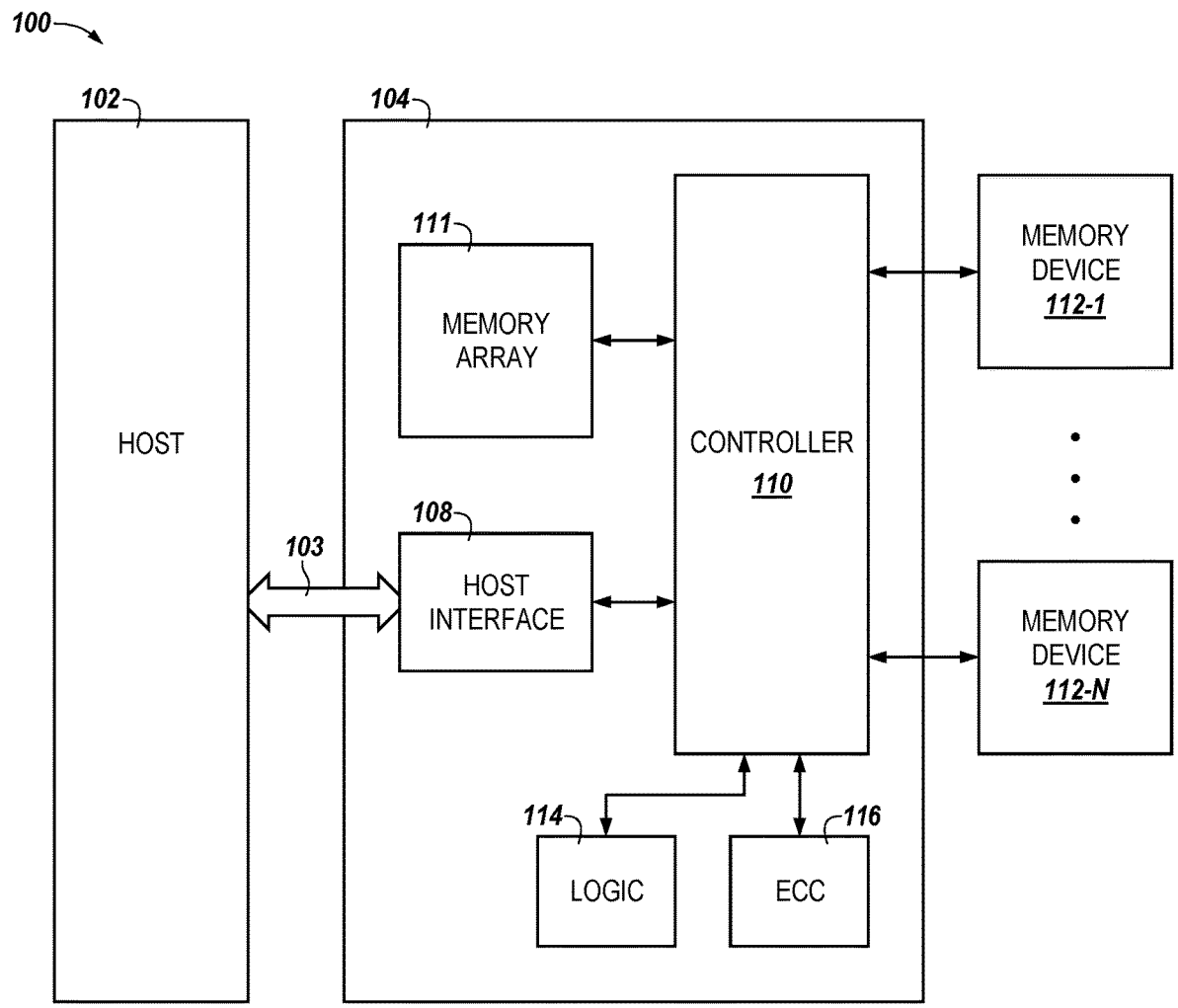
FIG. 1 is a functional block diagram in the form of a computing system including a memory apparatus in accordance with a number of embodiments of the present disclosure.

Systems, apparatuses, and methods related to configurable media structures are described. A memory device can be configured to boot up in a variety of configurations. The variety of configurations can include using the memory device for persistent memory storage, for non-persistent memory storage, etc. For instance, an apparatus can include a first memory array and a second memory array. The apparatus can include a memory controller coupled to the first memory array and the second memory array. The second memory array can be configured to store at least two boot images. The first memory array can be configured to operate based on which of the at least two boot images is used.

Memory devices, including flash memory devices, may be used to store data in a computing system and can transfer such data between a host associated with the computing system, and/or between applications running on the host associated with the computing system. The data stored in a memory device can be important or even critical to operation of the computing system and/or the application(s) running on the host. Operation of the computing system and/or the application(s) can be configurable by using a field programmable gate array (FPGA) structure. In some previous approaches, memory systems may be designed to boot up using a single boot image as the configuration of the memory system is set as the structure and coupling of the memory elements are set. In the embodiments described below, components of the memory device can be arranged using an FPGA in order to allow the components of the memory device to be configurable. By configuring the FPGA components of the memory device, the memory device can be used in a variety of ways, for example as a persistent memory versus a non-persistent memory. This configurability can be determined by a user.

As an example, the flexibility of the FPGA can provide the option to use the memory apparatus as a persistent memory by storing a plurality of logical to physical mapping data in a memory array of the FPGA. In this way, the memory array can track mapping of data stored in memory devices (e.g., NAND memory, variable resistance memory devices such as three-dimensional (3D) cross-point memory, phase change memory devices, self-selecting memory device, and/or NOR flash memory, etc.) coupled to the memory apparatus. In the alternative, the flexibility of the FPGA can provide the option to use the memory apparatus as a non-persistent memory by using the memory array, that would otherwise store the logical to physical mapping data, to store other data. By doing so, the persistence of the data stored in the memory devices may not be maintained in the location of the memory array of the FPGA but additional memory processing capability could be realized in the memory array instead.

In addition, as an example, the flexibility of the FPGA can provide the option to balance improved latency versus security, stronger error correction versus device wear, etc. For instance, encryption can be configurable such that increased encryption could result in increased latency and decreased encryption capability could result in decreased latency. In a similar fashion, error correction can be minimized towards a beginning of a life cycle of the memory apparatus and be configured to increase over time as the memory apparatus is put into use. In this way, the error correction can be configurable to respond to the need for increased error correction over time due to wear on memory cells of the memory apparatus.

In some embodiments, a flash memory can be used by the memory apparatus. Flash memory can be utilized as non-volatile memory for a wide range of electronic applications, including storing a boot image. Flash memory devices typically use a one-transistor memory cell that allows for high memory densities, high reliability, and low power consumption. Two common types of flash memory array architectures are the "NAND" and "NOR" architectures, so called for the logical form in which the basic memory cell configuration of each is arranged. In the NOR array architecture, the floating gate memory cells of the memory array are typically arranged in a matrix.

The gates of each floating gate memory cell of the array matrix are typically coupled by rows to word select lines and their drains are coupled to column bit lines. The NOR architecture floating gate memory array is accessed by a row decoder activating a row of floating gate memory cells by selecting the word select line coupled to their gates. The row of selected memory cells then place their data values on the column bit lines by flowing different currents depending on if a particular cell is in a programmed state or an erased state.

The flash memory NOR array can store a boot image that is used to boot up a memory device. A boot image can be a type of disk image that is a computer file containing the complete contents and/or structure of a computer storage media. As will be described further below, a different boot image can be used for each different structure of the storage media. As an example, a structure of the storage media can be configurable by using a field programmable gate array (FPGA), which can be configured in a plurality of different structural configurations. Each configuration can be associated with a boot image that is used to boot up the memory device for that particular structure.

An FPGA is an integrated circuit that can be configured by a user and/or at point of manufacture. The configuration of the FPGA can be specified using a hardware description language (HDL), similar to that used for an Application-Specific Integrated Circuit (ASIC). FPGAs contain an array of programmable logic blocks and a hierarchy of reconfigurable interconnects that can allow the blocks to be coupled together, in a similar fashion to logic gates that can be coupled in different configurations. Logic blocks can be configured to perform complex combinational functions, or merely simple logic gates such as AND, XOR, etc. In some FPGAs, logic blocks can include memory elements, which may be simple flip-flips or more complete blocks of memory. As will be described further below, these memory elements can include a memory controller, volatile memory arrays (e.g., DRAM, SRAM, etc.), ECC correction units, logic associated with persistence (e.g., logical to physical mapping tables, etc.), and/or queue logic to perform a number of queuing operations. Each of the configurations of these memory elements can be associated with a different boot image so that the memory elements are configurable based on which boot image is used to boot up the memory apparatus.

Further, many FPGAs can be reprogrammed to implement different logic functions, allowing flexible reconfigurable computing as performed in computer software, for example. As an example, a configurable FPGA can be configured to increase and/or decrease a latency of the data processing in order to correspondingly decrease and/or increase error correction, security, etc. As an example, by increasing the error correction, the latency can be increased, and, vice versa, decreasing the error correction can decrease the latency. Further, a particular structure can be associated with using the memory device for persistent memory or non-persistent memory, depending on desired characteristics for running the memory device, as will be described further below. In this way, integrating the FPGA into the memory apparatus can allow for application specific flexibility.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N," particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory devices) can refer to one or more memory devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 104 may reference element "04" in FIG. 1, and a similar element may be referenced as 204 in FIG. 2. A group or plurality of similar elements or components may generally be referred to herein with a single element number. For example, a plurality of reference elements 112-1, . . . , 112-N (e.g., 112-1 to 112-N) may be referred to generally as 112. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including a memory apparatus 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. The memory apparatus 104 can be a field programmable gate array (FPGA) including a non-persistent memory device, such as a DRAM and/or SRAM memory array, for instance, and can include an interface 108, a controller 110, e.g., a processor and/or other control circuitry, and a memory array 111, e.g., solid state memory devices such as NAND flash devices, which provide a storage volume for the memory apparatus 104. In a number of embodiments, the controller 110, a memory device 120, and/or the interface 108 can be physically located on a single die or within a single package, e.g., a managed NAND application. Also, in a number of embodiments, a memory, e.g., memory device 120, can include a single memory device or a plurality of memory devices.

The memory apparatus 104 can be coupled to a plurality of memory devices 112-1 to 112-N (referred to hereinafter collectively as memory devices 112). The memory devices 112 can include persistent memory devices, such as NAND flash memory, variable resistance memory, three-dimensional (3D) cross-point memory, NOR flash memory, etc. The memory devices 112 can be accessed by the memory apparatus 104 by control of the controller 110 through a data bus or other type of data transfer method (indicated by arrows between controller 110 and memory devices 112). The memory apparatus 104 can include a logic component 114 and an error correction code (ECC) component 116. The logic unit 114 can be used to maintain memory persistence with data stored in the memory devices 112 and the memory apparatus 104.

The ECC component 116 can include hardware and/or firmware to perform error correction operations according to a Bose, Chaudhuri, and Hocquenghem (BCH) error correction scheme, a low-density parity check (LDPC) error correction scheme, a Hamming error correction scheme, a classification code error correction scheme, and/or other type of error correction scheme for instance, which can facilitate error correction on data transferred between the memory apparatus 104 and the memory devices 112. In some embodiments, the ECC component 116 can receive data from the memory devices 112. The data may be encoded according to one or more ECC schemes prior to being transferred from the memory devices 112 to the memory apparatus 104 or from the memory apparatus 104 to the memory devices 112. Embodiments are not so limited, however, and in some embodiments, the ECC component 116 can receive unencoded data from the memory devices 112 and encode and/or subsequently decode the data according to one or more ECC schemes. As a result, the ECC component 116 can be responsible for performing all (or at least a portion of) error correction operations for the computing system 100.

In some embodiments, the interface 108 can be in the form of a standardized interface. For example, when the memory apparatus 104 is used for data storage in a computing system 100, the interface 108 can be a serial advanced technology attachment (SATA), peripheral component interconnect express (PCIe), or a universal serial bus (USB), a double data rate (DDR) interface, among other connectors and interfaces. In general, however, interface 108 can provide an interface for passing control, address, data, and other signals between the memory apparatus 104 and a host 102 having compatible receptors for the interface 108.

The host 102 can be a host system such as a personal laptop computer, a desktop computer, a digital camera, a mobile telephone, an internet-of-things (IoT) enabled device, or a memory card reader, graphics processing unit (e.g., a video card), among various other types of hosts. The host 102 can include a system motherboard and/or backplane and can include a number of memory access devices, e.g., a number of processing resources (e.g., one or more processors, microprocessors, or some other type of controlling circuitry). One of ordinary skill in the art will appreciate that "a processor" can intend one or more processors, such as a parallel processing system, a number of coprocessors, etc. The host 102 can be coupled to an interface 108 of the memory apparatus 104.

In some embodiments, the host 102 can be responsible for executing an operating system for a computing system 100 that includes the memory apparatus 104. Accordingly, in some embodiments, the host 102 can be responsible for controlling operation of the memory apparatus 104. For example, the host 102 can execute instructions (e.g., in the form of an operating system) that manage the hardware of the computing system 100 such as scheduling tasks, executing one or more applications, controlling peripherals, etc.

The computing system 100 can include separate integrated circuits on the host 102, the memory apparatus 104, the interface 108, the controller 110, and/or the memory devices 112-1 to 112-N or can be on the same integrated circuit. The computing system 100 can be, for instance, a server system and/or a high-performance computing (HPC) system and/or a portion thereof. In some embodiments, all or a portion of the memory elements of the memory apparatus 104 can be included on an FPGA. As an example, the memory array 111, the controller 110, the host interface 108, the logic component 114, and/or the ECC component 116 can be included on the FPGA. As will be described below, additional memory elements can be included in the memory apparatus 104 but may not be a part of the FPGA (e.g., such as NOR flash memory 220-1, 220-2, 220-3 in FIG. 2A). Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

In some approaches, the memory apparatus 104 (e.g., the controller 110), can use channels to access data (e.g., a memory cell and/or a group of cells, e.g., a data word, or sector) stored in the memory devices 112, for the execution of applications. The applications can be executed on the host 102 using data stored in the memory devices 112. The term "executed on" may be used interchangeably with other terms such as "resident on," "deployed on" or "located on," herein. The channels can be enabled by the controller 110 to provide the data stored in the memory devices 112 to the applications. The applications can be tailored to perform in a particular way. As an example, an application can be operated to use the memory devices 112 in a non-persistent way and use a portion of the memory apparatus 104, e.g., the memory array 111, for data operations other than maintaining persistency of the data. In the alternative, the application can be operated to use memory in a persistent way, thereby using the memory array 111 to maintain persistency of the data in the memory devices 112, thereby using portions of the memory array 111 that would otherwise be used for data operations.

In some embodiments, as described herein, the controller 110 can determine whether an application is requesting to use the memory devices 112 in a persistent or a non-persistent way. Such a request can be based on Quality of Service (QoS) parameters. For instance, it may be beneficial to allow overprovisioning of the memory apparatus under certain circumstances. Further, configurable media structures may allow for stringent QoS requirements to be met when requested and reduced when not requested. This may allow for resource conversation and/or conservation of power consumption while still meeting QoS guidelines.

In response to the request, the controller 110 can modify which boot image is being used for operation of the memory apparatus 104, either by rebooting the memory apparatus 104 or in some other fashion. Upon modification of the boot image being used, the memory devices 112 can be used as requested by the application (e.g., in a persistent way or a non-persistent way). Likewise, a level of latency and/or security can be determined and a boot image associated with that particular latency and/or security can be chosen. For example, an application can request to have a high security level and thereby increase the latency of the memory apparatus 104. In the alternative, an application can request to have a low security level and thereby decrease latency in the memory. The FPGA can be configured to meet these and other criteria requested.

However, in some embodiments, the criteria may not be implemented based on a request but rather on a change in a threshold, a change in a characteristic of the memory apparatus 104, etc. For example, an increase in errors in the data may reach beyond a threshold and, in response, an increase in error correction may occur. The FPGA can be reconfigured to increase the error correction and likewise decrease other operational abilities of the memory apparatus 104. Similarly, an increase in hacking attempts or an increase in security issues can cause a reconfiguration of the FPGA to increase security and thereby increase latency.

The controller 110 can communicate with the memory devices 112-1 to 112-N to control data, perform read, write, and erase operations, among other operations. The controller 110 can include, for example, a number of components in the form of hardware and/or firmware, e.g., one or more integrated circuits, such as application-specific integrated circuit(s) (ASIC(s)), field-programmable gate array(s) (FPGA(s)), and/or software for controlling access to the number of memory devices 112-1 to 112-N and/or for facilitating data transfer between the host 102 and memory devices 112-1 to 112-N. The controller 110 can include various components not illustrated so as not to obscure embodiments of the present disclosure to control data read, write, erase, etc. operations. Such components may not be components of controller 110 in some embodiments, e.g., the components to control data read, write, erase, etc. operations can be independent components located within the memory apparatus 104.

The memory devices 112 can include a number of arrays of memory cells. The arrays can be flash arrays with a NAND architecture, a 3D cross-point architecture (3D XP™), and/or a NOR architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes.

The memory devices 112 can include volatile memory and/or non-volatile memory. In a number of embodiments, memory devices 112 can include a multi-chip device. A multi-chip device can include a number of different memory types and/or memory modules. For example, a memory system can include non-volatile or volatile memory on any type of a module. In embodiments in which the memory devices 112 include non-volatile memory, the memory devices 112 can be flash memory devices such as NAND or NOR flash memory devices. Embodiments are not so limited, however, and the memory devices 112 can include other non-volatile memory devices such as non-volatile random-access memory devices (e.g., NVRAM, ReRAM, FeRAM, MRAM, PCM), "emerging" memory devices such as variable resistance (e.g., 3-D Crosspoint (3D XP) memory devices), memory devices that include an array of self-selecting memory (SSM) cells, etc., or combinations thereof. Variable resistance memory devices can perform bit storage based on a change of bulk resistance, in conjunction with a stackable cross-gridded data access array. Additionally, in contrast to many flash-based memories, variable resistance non-volatile memory can perform a write in-place operation, where a non-volatile memory cell can be programmed without the non-volatile memory cell being previously erased. In contrast to flash-based memories and variable resistance memories, self-selecting memory cells can include memory cells that have a single chalcogenide material that serves as both the switch and storage element for the memory cell.

The memory devices 112 can provide main memory for the computing system 100 or can be used as additional memory or storage throughout the computing system 100. Each memory device 112 can include one or more arrays of memory cells, e.g., volatile and/or non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1 can include additional circuitry that is not illustrated so as not to obscure embodiments of the present disclosure. For example, the memory apparatus 104 can include address circuitry to latch address signals provided over I/O connections through I/O circuitry. Address signals can be received and decoded by a row decoder and a column decoder to access the memory devices 112. It will be appreciated by those skilled in the art that the number of address input connections can depend on the density and architecture of the memory devices 112.

Figure 2A:
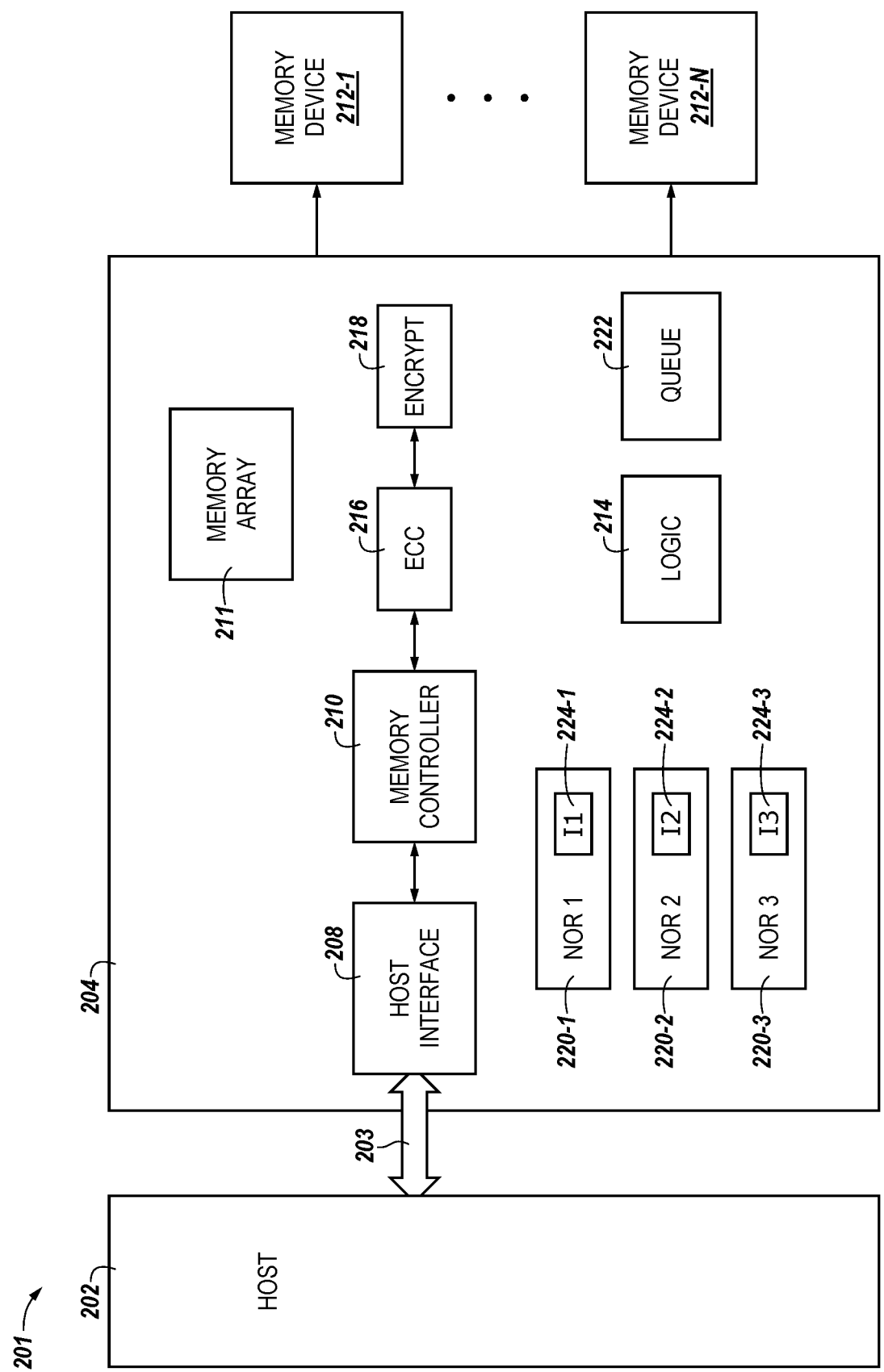
FIGS. 2A-2B are each a functional block diagram in the form of a computing system including a configurable memory apparatus in accordance with a number of embodiments of the present disclosure.

FIG. 2A is a functional block diagram in the form of a computing system 201 including a configurable memory apparatus 204 in accordance with a number of embodiments of the present disclosure. The computing system 201 can include a host 202, a memory apparatus 204, and memory devices 212-1 to 212-N (hereinafter referred to collectively as memory devices 212). The memory apparatus 204 can include a memory controller 210, which may also be referred to simply as "logic," and which is distinct from a memory controller that may be located at host 202, in communication with the host 202 through a host interface 208 via a bus 203. As an example, in some embodiments, the logic or memory controller can be located external to a host 202 and on a memory apparatus 204. In some embodiments, the logic or memory controller can be located on a host 202.

The memory array 211 can be volatile memory including a DRAM memory array, an SRAM memory array, an RRAM memory array, etc. The memory array 211 can be used to store logical to physical (L2P) table (e.g., such as a deep storage holding table) for maintaining persistence of the data transferred from the memory devices 212. In the alternative, the memory array 211 can be used as a secondary cache whereby the portion that would store the L2P tables are used for secondary cache storage.

The memory apparatus 204 can include an ECC component 216 and an encryption component 218 to perform various error correction and encryption operations, respectively. The encryption component 218 can be an Advanced Encryption Standard (AES) based component, referring to a specification for encryption of electronic data. The ECC component 218 can be configurable to increase or decrease the level of encryption based on requests to increase or decrease the level of encryption. Likewise, the level of encryption can be increased or decreased based on a request to increase or decrease latency, respectively. In this way, a request to increase encryption can increase latency and a request to increase latency can increase encryption. Further, a request to decrease latency can decrease encryption and a request to increase latency can increase encryption.

The memory apparatus can further include a logic component 214 and a queue component 222. The logic component 214 can be used to maintain persistence of the data stored in the memory devices 212. The queue component 222 can provision computing resources and circuitry to orchestrate the operations of the applications. The queue component 222 can queue the requests for data from the applications. In some embodiments, the memory controller 210 may determine a priority level of the applications and facilitate the priority of the requests based on the determination of the controller. Low priority applications may include applications that request data less frequently compared to high priority applications and/or do not serve an important purpose for the host when executed. A high priority application may include applications that frequently request data compared to low priority applications and/or serve an important purpose when executed. Some high priority applications may request data from the memory devices 212 infrequently but the data when executed may be important to the host.

The memory apparatus 204 can include a plurality of non-volatile memory arrays (e.g., NOR flash memory arrays, flash memory arrays, etc.) 220-1, 220-2, 220-3 (hereinafter referred to collectively as non-volatile memory arrays 220. The plurality of non-volatile memory arrays 220 can each store a boot image and/or be configured to execute the boot image to boot up the memory apparatus 204. For example, a first boot image "I1" 224-1 can be associated with a first non-volatile memory array 220-1, a second boot image "I2" 224-2 can be associated with a second non-volatile memory array 220-2, a third boot image "I3" 224-3 can be associated with a third non-volatile memory array 220-3, etc. While three non-volatile memory arrays are illustrated along with three boot images, embodiments are not so limited. Any number of non-volatile memory arrays and/or boot images may be used. In some previous approaches, multiple boot images were avoided due to the extra processing cost of validating each of the boot images. In addition, unless a memory system is configurable to use more than one boot image without changing out hardware and/or structure of the memory system, more than one boot image may be inoperable. Each of the boot images 224 illustrated in FIG. 2A can be used to boot up a different configuration of the FPGA. The FPGA can include a number of the memory elements, such as the host interface 208, the memory controller 210, the memory array 211, the ECC component 216, the encryption component 218, the logic component 214, and/or the queue component 222. The non-volatile memory arrays 220 may not be part of, or external to, the FPGA.

Figure 2B:
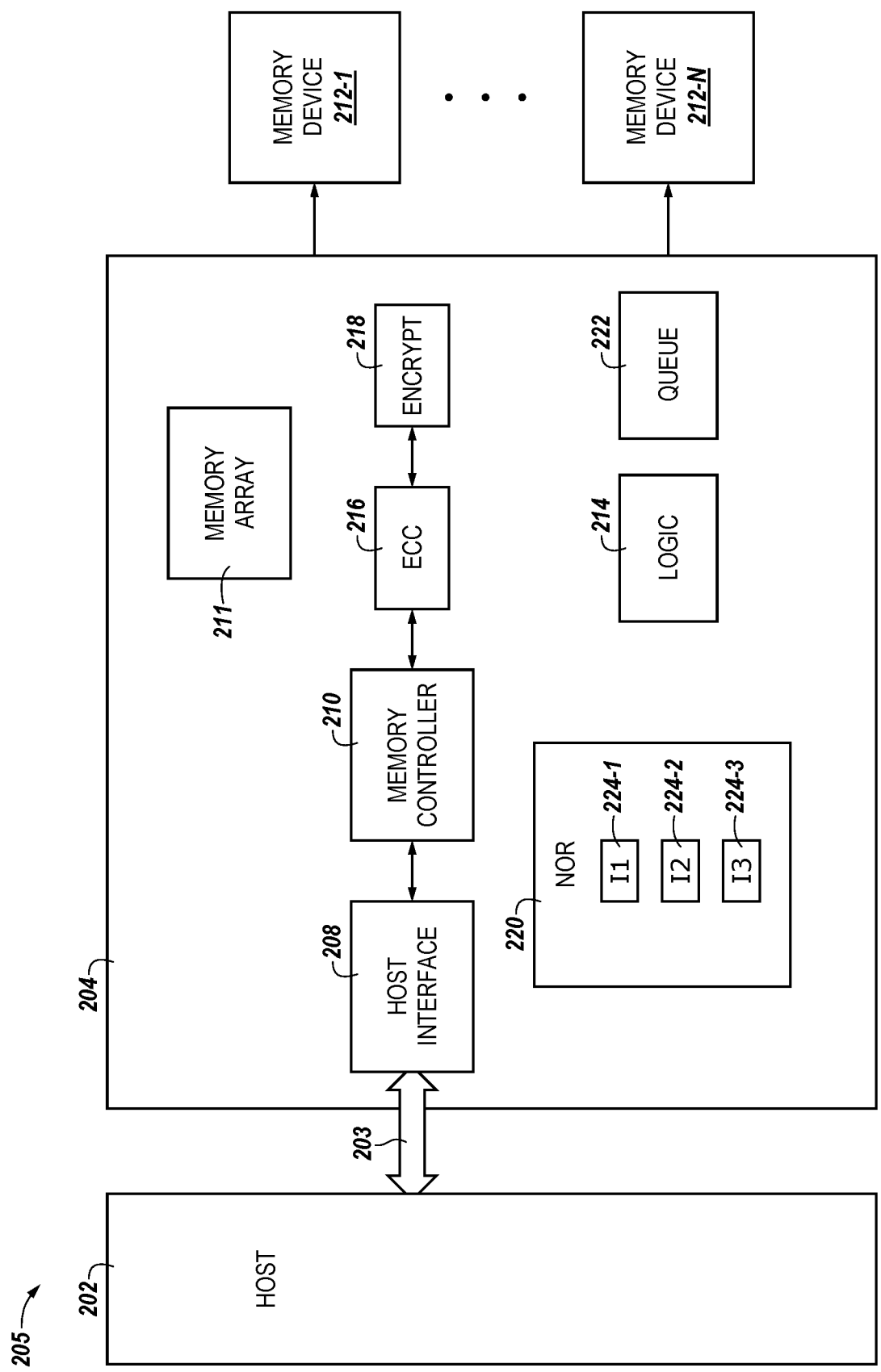

FIG. 2B is a functional block diagram in the form of a computing system 205 including a configurable memory apparatus 204 in accordance with a number of embodiments of the present disclosure. FIG. 2B can have similar components to FIG. 2A in that the FPGA contains similar memory elements, such as host interface 208, memory controller 210, ECC component 216, encryption component 218, logic component 214, and/or queue component 222. However, FIG. 2B illustrates an embodiment including a single non-volatile (e.g., NOR flash) memory array 220 that includes three boot images ("I1" 224-1, "I2" 224-2, "I3" 224-3). In this way, a single non-volatile memory array can store a plurality of boot images 224 and process one of the plurality of boot images 224 in order to operate the memory apparatus 204. As described above, each of the boot images 224 corresponds to a particular configurable structure of the memory apparatus 204 in order to perform particular operations in a particular way. As an example, a first boot image 224-1 can be used to operate the memory apparatus 204 using persistent memory, a second boot image 224-2 can be used to operate the memory apparatus 204 using non-persistent memory, a third boot image 224-3 can be used to operate the memory apparatus in an increase security and increase latency mode, etc.

Figure 3:
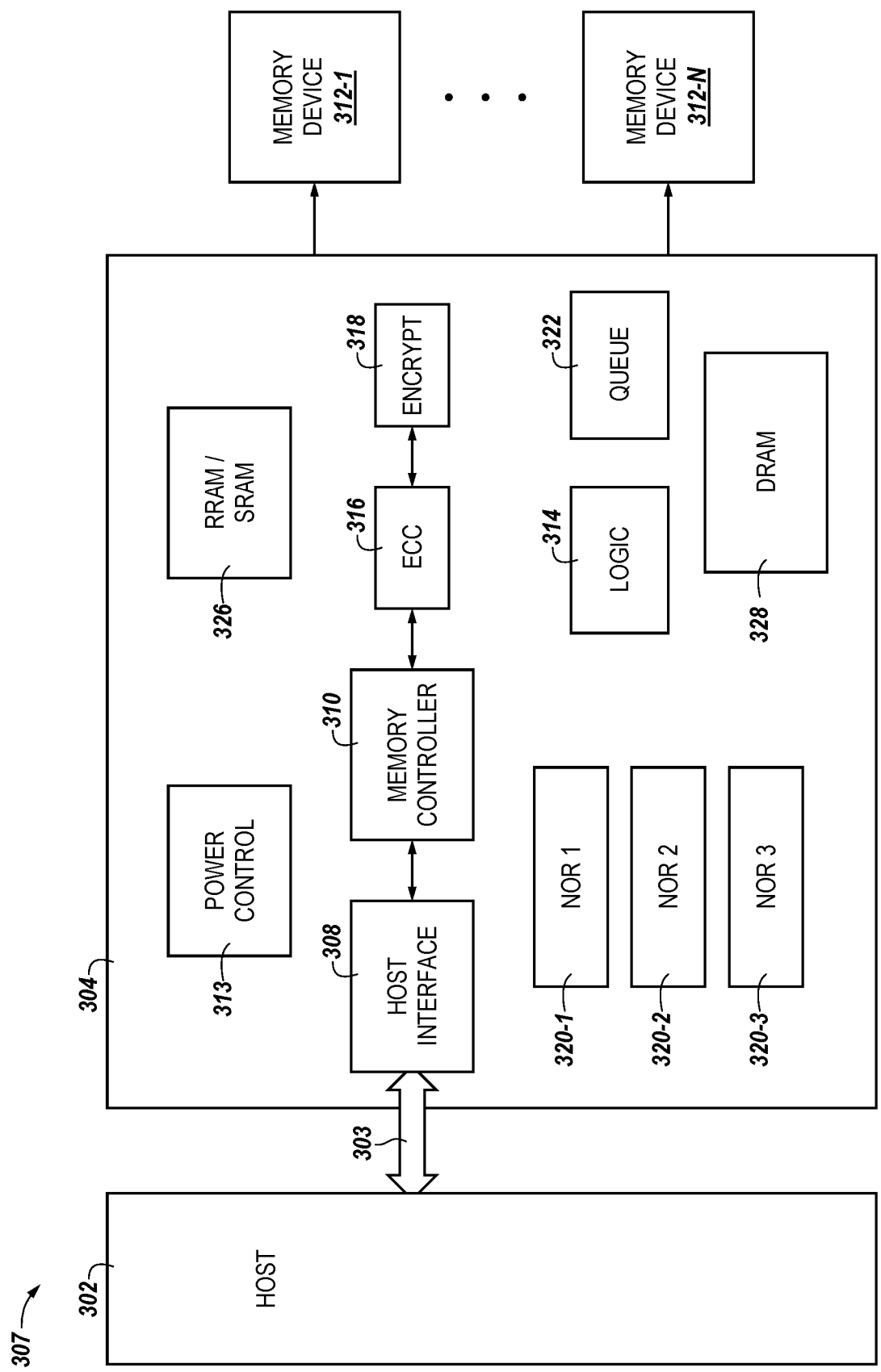
FIG. 3 is a functional block diagram in the form of a computing system including a configurable memory apparatus in accordance with a number of embodiments of the present disclosure.

FIG. 3 is a functional block diagram in the form of a computing system 307 including a memory apparatus 304 in accordance with a number of embodiments of the present disclosure. The memory apparatus 304 can be similar to FIGS. 2A-2B in that the memory elements included in the FPGA are similar. However, the memory array can be a particular memory array including RRAM/SRAM 326. The RRAM/SRAM 326 can be configurable to either store persistency data including logical to physical (L2P) tables or store data as a secondary cache, depending on requested preferences of performance of the memory apparatus 304. Likewise, a volatile memory array such as DRAM 328 can be external to the FPGA and also used to store L2P tables or store data as a secondary cache. In this way, the memory array being used for different functionalities of the configurable FPGA can be internal or external to the FPGA. However, embodiments are not so limited as the flexibility of this setup due to using an FPGA allows for more embodiments than are illustrated in FIGS. 1-3.

Figure 4:
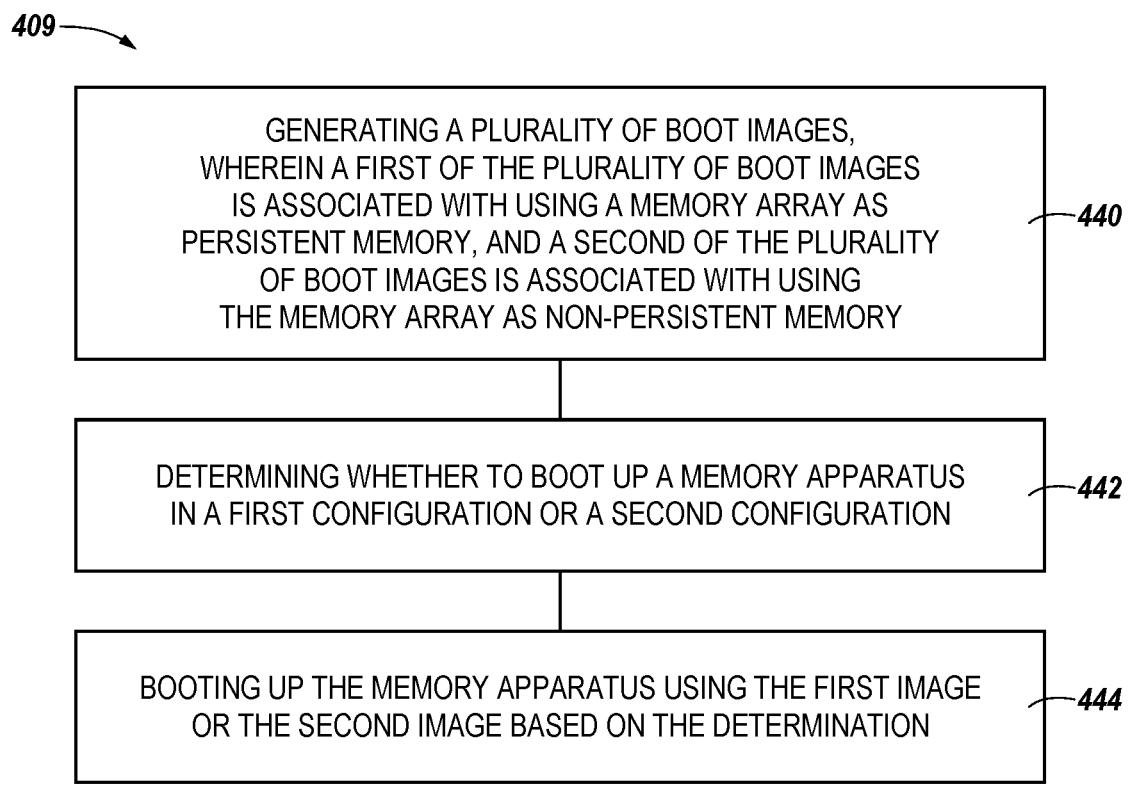
FIG. 4 is a flow diagram representing an example method for configuring a memory apparatus in accordance with a number of embodiments of the present disclosure.

FIG. 4 is a flow diagram representing an example method 409 for configuring a memory apparatus in accordance with a number of embodiments of the present disclosure. At block 440, the method 409 can include generating a plurality of boot images (e.g., the boot images 224 illustrated in FIGS. 2A and 2B, herein). A first of the plurality of boot images can be associated with using a memory array as persistent memory. A second of the plurality of boot images can associated with using the memory array as non-persistent memory. The memory apparatus can be booted up using whichever boot image corresponds to a requested configuration for the memory apparatus to perform operations.

At block 442, the method 409 can include determining whether to boot up a memory apparatus in a first configuration or a second configuration. The determination can be based on data requesting a particular configuration received from a host, from a user, etc. The determination of whether to boot up in a first configuration or a second configuration can be based on a threshold value being met in the memory apparatus and/or particular metrics of the memory apparatus. As an example, as the memory cells of the memory apparatus wear down, their functioning can be affected and the memory apparatus can determine to operate the memory apparatus in a particular configuration to compensate for such wear. The particular configuration can include increasing an amount of error correction within the memory apparatus, for example.

At block 444, the method can include booting up the memory apparatus using the first image or the second image based on the determination. Booting up the memory apparatus can include booting up a field programmable gate array (FPGA) of the memory apparatus. The memory elements, described in association with FIGS. 1-3, can be reprogrammed using the flexibility of the FPGA in order to operate in the configuration associated with the boot image used. In this way, a different boot image could be used for each time the memory apparatus is booted up, resulting in a different configuration being used each time the memory apparatus is booted up.

In some embodiments, the method can further include storing the first image and the second image in a NOR flash array. In some embodiments, the method can further include storing the first image in a first NOR flash array and storing the second image in a second NOR flash array. The method can further include, in response to booting up the memory apparatus using the first image, storing logical-to-physical mapping data in a volatile memory array of the memory apparatus. The method can further include, in response to booting up the memory apparatus using the second image, not storing logical-to-physical mapping data in the memory device.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   generating a plurality of boot images, wherein:
     a first boot image of the plurality of boot images comprises instructions for using a memory array in a persistent memory configuration; and
     a second boot image of the plurality of boot images comprises instructions for using the memory array in a non-persistent memory configuration;
   determining whether to boot up a memory apparatus in a first configuration with the memory array having the persistent memory configuration or a second configuration with the memory array having the non-persistent memory configuration; and
   booting up the memory apparatus using the first boot image or the second boot image based on the determination.

2. The method of claim 1, further comprising storing the first boot image and the second boot image in a NOR flash array.

3. The method of claim 1, further comprising storing the first boot image in a first NOR flash array and storing the second boot image in a second NOR flash array.

4. The method of claim 1, further comprising, in response to booting up the memory apparatus using the first boot image, storing logical-to-physical mapping data in a volatile memory array of the memory apparatus.

5. The method of claim 1, further comprising, in response to booting up the memory apparatus using the second boot image, not storing logical-to-physical mapping data in the memory device.

6. The method of claim 1, wherein booting up the memory apparatus comprises booting up a field programmable gate array (FPGA).

7. An apparatus comprising:
   a first memory array;
   a second memory array; and
   logic coupled to the first memory array and the second memory array;
   wherein:
     the first memory array and the logic are within a field programmable gate array (FPGA); and the second memory array is configured to store at least two boot images and the first memory array is configured to operate in a first configuration with the first memory array having a persistent memory configuration or a second configuration with the first memory array having a non-persistent memory configuration, based on which of the at least two boot images is used.

8. The apparatus of claim 7, wherein the logic is configured to boot up the apparatus with either of the at least two boot images.

9. The apparatus of claim 7, wherein the first memory array is a volatile memory array and the second memory array is a non-volatile memory array.

10. The apparatus of claim 7, wherein the apparatus is coupleable to a memory device.

11. The apparatus of claim 10, wherein the memory device is a variable resistance memory device and the logic is configured to use the variable resistance memory device as persistent storage by storing storage table data in the first memory array.

12. The apparatus of claim 10, wherein:
    the memory device is a variable resistance memory device; and
    the logic is configured to use the variable resistance memory device in a non-persistent memory configuration.

13. The apparatus of claim 7, wherein the second memory array comprises a NOR flash array.

14. The apparatus of claim 7, wherein the logic is configured to:
    perform a first boot up with a first of the at least two boot images; and
    a second boot up with a second of the at least two boot images.

15. An apparatus comprising:
    a volatile memory array;
    a plurality of non-volatile memory arrays; and
    logic coupled to the volatile memory array and the plurality of non-volatile memory arrays;
    wherein:
      the logic is configured to use a storage table portion of the volatile memory array as a secondary cache for non-address tracking operations; and
      the plurality of non-volatile memory arrays are each configured to store a boot image and the volatile memory array is configured based on which stored boot image is used.

16. The apparatus of claim 15, wherein each of the plurality of boot images are configured to be used to boot up the apparatus.

17. The apparatus of claim 15, wherein the plurality of non-volatile memory arrays are a plurality of NOR flash arrays.

18. The apparatus of claim 15, wherein the apparatus is bootable using at least one of the boot images stored in the plurality of non-volatile memory arrays.

19. The apparatus of claim 15, wherein the apparatus is bootable using an additional boot image stored in one of the plurality of non-volatile memory arrays.

20. An apparatus, comprising:
a configurable volatile memory array, wherein the configurable volatile memory array is configurable to:
be used in a persistent memory configuration or a non-persistent memory configuration; and
adjust an error correction rate and a latency rate; and
a plurality of flash memory arrays each configured to store a boot image, wherein:
a first of the boot images is associated with the configurable volatile memory array configured to be used in a persistent memory configuration; and
a second of the boot images is associated with the configurable volatile memory array configured to be used in a non-persistent memory configuration.

21. The apparatus of claim 20, further comprising logic, wherein the logic is configured to:
boot up the apparatus using the first boot image or the second boot image; and
decrease an error correction rate and increase a latency rate based on whether the apparatus is booted using the first boot image or the second boot image.

22. The apparatus of claim 20, further comprising logic, wherein the logic is configured to:
boot up the apparatus using the first boot image or the second boot image; and
increase an error correction rate and decrease a latency rate based on whether the apparatus is booted using the first boot image or the second boot image.

23. The apparatus of claim 20, wherein the configurable volatile memory array associated with the second boot image is configured to decrease an error correction rate and increase a latency rate.

* * * * *